United States Patent [19]
Tateyama

[11] Patent Number: 5,912,054
[45] Date of Patent: Jun. 15, 1999

[54] COATING METHOD AND APPARATUS

[75] Inventor: Kiyohisa Tateyama, Kumamoto, Japan

[73] Assignee: Tokyo Electron Limited, Tokyo, Japan

[21] Appl. No.: 08/915,610

[22] Filed: Aug. 21, 1997

[30] Foreign Application Priority Data

Aug. 30, 1996 [JP] Japan .................................. 8-249228

[51] Int. Cl.⁶ .............................. B05D 1/02; B05D 3/12; B08B 7/00; B05B 3/00
[52] U.S. Cl. ......................... 427/425; 427/240; 118/323; 134/6; 222/108; 222/423; 222/566
[58] Field of Search .................... 427/240, 421, 427/424, 425; 118/323; 222/108, 423, 566, 571; 134/6, 8, 9, 24

[56] References Cited

U.S. PATENT DOCUMENTS

| | | | |
|---|---|---|---|
| 3,656,200 | 4/1972 | Riley, Jr. ...................................... | 134/6 |
| 3,874,394 | 4/1975 | Robertson ................................... | 134/6 |
| 3,977,898 | 8/1976 | Hwa ............................................ | 134/6 |
| 4,042,415 | 8/1977 | Hwa ............................................ | 134/6 |
| 4,259,372 | 3/1981 | Eddy . | |
| 4,416,213 | 11/1983 | Sakiya . | |
| 4,482,391 | 11/1984 | Pettingell et al. ........................... | 134/8 |
| 4,599,967 | 7/1986 | Murphy et al. ........................... | 118/323 |
| 5,002,008 | 3/1991 | Ushijima et al. . | |
| 5,695,817 | 12/1997 | Tateyama et al. ....................... | 427/240 |

FOREIGN PATENT DOCUMENTS

| | | |
|---|---|---|
| 3915549 A1 | 11/1990 | Germany . |
| 07080385 | 3/1995 | Japan . |
| 07080386 | 3/1995 | Japan . |

Primary Examiner—Marianne Padgett
Attorney, Agent, or Firm—Oblon, Spivak, McClelland, Maier & Neustadt, P.C.

[57] ABSTRACT

A coating apparatus has a nozzle for delivering a photo-resist liquid onto a semiconductor wafer supported by a spin chuck. The nozzle is movable between a supply position and a wait position. At the wait position, there are a roller which is rotatable in one direction and has a circumferential surface with thinner thereon, and a wiper for wiping the circumferential surface of the roller. While the nozzle is located at the wait position, a waiting mode is first performed, and a preparing mode is then performed immediately before the nozzle is moved from the wait position to the supply position. In the waiting mode, delivery of the photo-resist liquid from the nozzle is stopped and the wiper is located at a retreat position, such that a tip port of the nozzle is wetted by the thinner present on the circumferential surface of the roller. In the preparing mode, the processing liquid is delivered from the tip port of the nozzle onto the circumferential surface of the roller, and the wiper is located at a project position such that the processing liquid is removed from the circumferential surface of the roller.

17 Claims, 5 Drawing Sheets

COATING METHOD AND APPARATUS

BACKGROUND OF THE INVENTION

The present invention relates to a coating method and apparatus, and, in particular, to a method and apparatus for coating a target object, such as a semiconductor wafer or an LCD substrate, with a processing liquid, such as a photo-resist liquid, which undesirably tends to become dry. The semiconductor process includes various kinds of processes which are performed to manufacture a semiconductor device or a structure having, for example, wiring layers and electrodes to be connected to a semiconductor device on a target object, such as a semiconductor wafer or an LCD substrate, by forming semiconductor layers, insulating layers, and conductive layers in predetermined patterns on the target object.

In a process of manufacturing a semiconductor device or an LCD, coating apparatuses are utilized in various steps. A representative one of them is a coating apparatus of a photo-resist liquid, employed in a coating and developing system of the photo-resist. The photo-resist liquid is applied onto a target layer to be pattern-etched, such as a semiconductor, insulating, or conductive layer on a semiconductor, to form a photo-resist film on the target layer. The photo-resist film is exposed to light through a predetermined mask and is developed so that the film is patterned to copy the mask. Then, the target layer is etched, using the patterned photo-resist film as a mask.

Figure 6A:
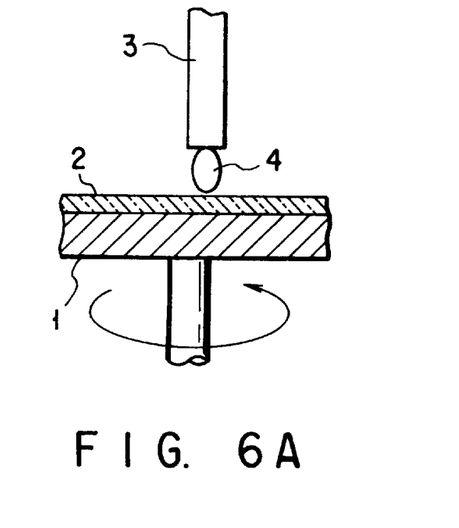
FIGS. 6A and 6B are views schematically showing coating and waiting sections, respectively, of a conventional coating apparatus.

A coating method as shown in FIG. 6A is known as a coating method of a photo-resist liquid. This method employs a nozzle 3 for supplying a processing liquid 4, i.e., a photo-resist liquid formed by dissolving a photo-sensitive resin in a solvent, and a spin chuck 1 for holding a semiconductor wafer W. During a coating process, the processing liquid 4 is supplied, i.e., dropped onto the wafer W from the nozzle 3 arranged above the spin chuck 1, while the spin chuck 1 is rotated. As a result, the processing liquid 4 is diffused from the central portion of the wafer W to its peripheral portion, so that the entire top surface of the wafer is uniformly coated with a photo-resist film.

Figure 6B:
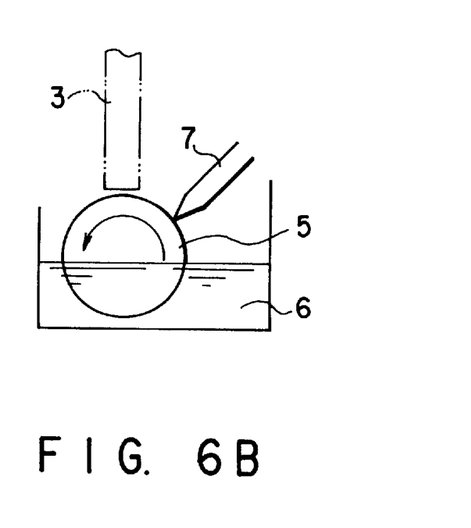

In such a coating apparatus, if the processing liquid, i.e., the photo-resist liquid 4, hardens in the nozzle 3, problems arise such that the nozzle 3 becomes plugged and hardly any uniform photo-resist film is formed. The processing liquid 4 hardens mainly due to the processing liquid 4 becoming dry while the nozzle 3 is in a waiting state. In order to solve this problem, a method of preventing the photo-resist liquid from drying at a wait position of the nozzle 3 has been developed, as shown in FIG. 6B. This method employs a roller 5 having a lower part dipped in thinner 6 which is a solvent for the processing liquid, i.e., the photo-resist liquid 4. The processing liquid 4 is delivered from the nozzle 3 onto the roller 5 while the processing liquid 4 is removed from the roller 5 by a fixed wiper 7.

Since the tip port of the nozzle 3 is provided with the thinner 6 drawn up by the roller 5 in this method, the tip port of the nozzle 3 is prevented from drying. However, the processing liquid is constantly delivered in the waiting state, resulting in a waste of the processing liquid. If the processing liquid temporarily stops being delivered, the thinner 6 on the roller 5 is removed by the wiper 7, thereby bringing about problems such that the tip port of the nozzle 3 dries and the processing liquid deteriorates or hardens.

The wiper 7 plays an important role in removing the processing liquid and the like adhered to the roller 5, and, therefore, should not be omitted. Without the wiper 7, the processing liquid would deteriorate by transfer of substances from the roller 5 onto the tip port of the nozzle, resulting in hardly any coating film of a uniform thickness being obtained.

BRIEF SUMMARY OF THE INVENTION

An object of the present invention, therefore, is to provide a coating method and apparatus which can prevent a processing liquid from deteriorating, e.g., hardening, in the tip port of a nozzle in a waiting state, thereby enabling the forming of a coating film having a uniform thickness.

According to a first aspect of the present invention, there is provided a coating method of coating a target object with a processing liquid delivered from a tip port of a nozzle, which is movable between a supply position for supplying the processing liquid onto the target object and a wait position for waiting when not supplying the processing liquid onto the target object, such that, in the wait position, the tip port of the nozzle is wetted by a solvent for the processing liquid, the solvent being present on a circumferential surface of a rotatable roller which is selectively wiped by a wiper, the method comprising the steps of:

performing a waiting mode, during which the nozzle is located at the wait position, wherein, in the waiting mode, delivery of the processing liquid from the tip port of the nozzle is stopped and the wiper is located at a retreat position, such that the tip port of the nozzle is wetted by the solvent present on the circumferential surface of the roller;

performing a preparing mode, during which the nozzle is located at the wait position, after the waiting mode and immediately before moving the nozzle from the wait position to the supply position, wherein, in the preparing mode, the processing liquid is delivered from the tip port of the nozzle onto the circumferential surface of the roller, and the wiper is located at a project position such that the processing liquid is removed from the circumferential surface of the roller; and performing a coating mode, during which the nozzle is located at the supply position, after the preparing mode, wherein, in the coating mode, the processing liquid is delivered from the tip port of the nozzle such that the processing liquid is applied to the target object.

According to a second aspect of the present invention, there is provided a coating apparatus for coating a target object with a processing liquid, comprising:

a support for supporting the target object;

a nozzle having a tip port for delivering the processing liquid onto the target object supported by the support;

a processing liquid supply for supplying the processing liquid to the nozzle;

a nozzle shifter for moving the nozzle between a supply position for supplying the processing liquid onto the target object and a wait position for waiting when not supplying the processing liquid onto the target object;

a rotatable roller having a circumferential surface, which faces the tip port of the nozzle when the nozzle is located at the wait position;

a solvent supply for supplying a solvent for the processing liquid to the circumferential surface of the roller;

a wiper for wiping the circumferential surface of the roller;

a wiper shifter for moving the wiper between a project position for wiping the circumferential surface of the roller and a retreat position for not wiping the circumferential surface of the roller; and a controller for controlling the nozzle shifter, the processing liquid supply, and the wiper shifter;

wherein the controller performs a waiting mode, during which the nozzle is located at the wait position, and performs a preparing mode, during which the nozzle is located at the wait position, after the waiting mode and immediately before moving the nozzle from the wait position to the supply position, wherein, in the waiting mode, delivery of the processing liquid from the tip port of the nozzle is stopped and the wiper is located at the retreat position, such that the tip port of the nozzle is wetted by the solvent present on the circumferential surface of the roller, and wherein, in the preparing mode, the processing liquid is delivered from the tip port of the nozzle onto the circumferential surface of the roller, and the wiper is located at the project position such that the processing liquid is removed from the circumferential surface of the roller.

In a coating method and apparatus according to the present invention, while a nozzle is located at a wait position, a waiting mode is first performed, and a preparing mode is then performed immediately before the nozzle is moved from the wait position to a supply position. In the waiting mode, delivery of a photo-resist liquid from the nozzle is stopped and a wiper is located at a retreat position, such that a tip port of the nozzle is wetted by a solvent present on the circumferential surface of a roller. By doing so, in a waiting state, the solvent prevents the tip port of the nozzle from drying, and the processing liquid adhered to the circumferential surface of the roller is effectively removed by the solvent. Further, in the preparing mode, the processing liquid is delivered from the tip port of the nozzle onto the circumferential surface of the roller, and the wiper is located at a project position such that the processing liquid is removed from the circumferential surface of the roller. By doing so, the condition of the processing liquid in the tip port of the nozzle is adjusted immediately before a coating process, so that a coating film of the processing liquid having a uniform thickness can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
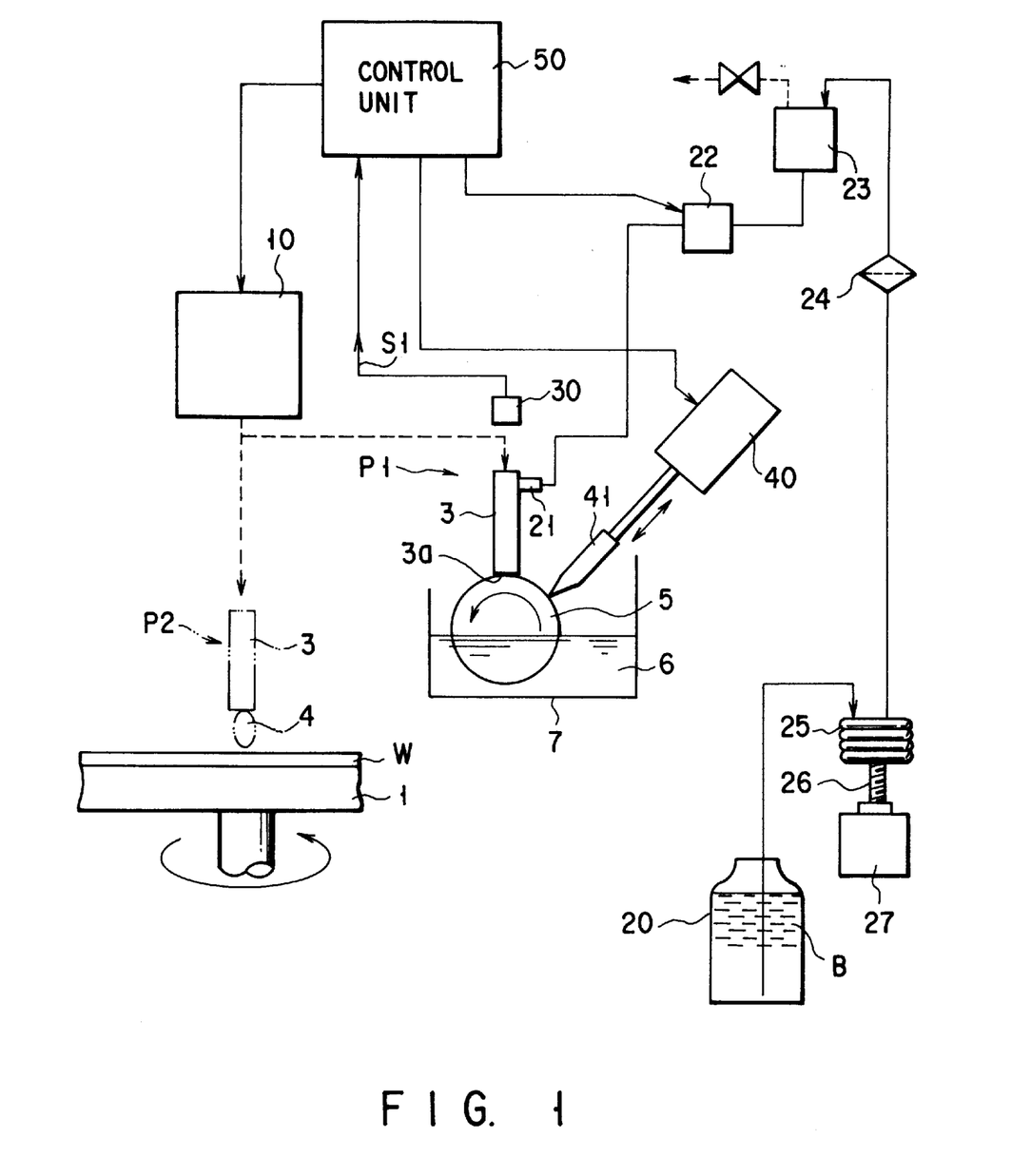
FIG. 1 is a structural view schematically showing a coating apparatus according to an embodiment of the present invention.

As shown in FIG. 1, a coating apparatus according to an embodiment of the present invention has a holder for holding a target object, e.g., a semiconductor wafer W, in a horizontal state, such as a spin chuck 1 for attracting and holding the wafer W by means of vacuum. A nozzle 3 is arranged above the spin chuck 1, and is formed of a pipe nozzle having tip port 3a for delivering a photo-resist liquid, i.e., a processing liquid 4, onto the wafer W. The nozzle 3 can be moved by a nozzle shifter 10 between a wait position P1 and a supply position P2. The nozzle 3 is connected to a tank storing the photo-resist B, i.e., a processing liquid source 20, through a tube 21.

Between the tube 21 and the tank 20, there are an air operation valve 22, a bubble removing mechanism 23 for removing bubbles in the photo-resist liquid, a filter 24, and a flow controller 25, such as a bellows pump, in this order. The flow controller 25 is expandable under control of a driving unit so as to send a predetermined amount of the photo-resist liquid B to the nozzle 3. The predetermined amount of the photo-resist liquid B sent from the flow controller 37 is supplied, e.g., dropped, as the processing liquid 4 from the nozzle 3 onto the center of the wafer W.

The flow controller 25 can control the supply rate of the photo-resist liquid down to a small amount as compared to a conventional technique. The driving unit has a ball screw member 26 formed of a screw connected to the flow controller 25 and a nut engaging with the screw. The ball screw member 26 is driven by a servo motor or stepping motor 27 including a servo mechanism, which rotates the nut to linearly move the screw.

In the above described system of supplying the photo-resist or processing liquid, the delivery time of the processing liquid 4 is controlled by means of the driving time of the stepping motor 27 of the flow controller 25. The delivery rate of the processing liquid 4 is adjusted by means of driving conditions of the flow controller 25, such as driving time and driving speed, and opening/closing operation, i.e., ON/OFF operation, of the valve 22 for opening/closing the processing liquid passageway. Setting the driving time of the flow controller 25 and the ON/OFF operation of the valve 22 are automatically controlled by a control unit 50 on the basis of a preset program.

The wait position P1 is provided with a roller 5 rotatable in one direction which has a circumferential surface to face the tip port 3a of the nozzle 3 when the nozzle 3 is located at the waiting position P1. The lower part of the roller 5 is dipped in thinner 6 which is a solvent of the processing liquid, i.e., the photo-resist liquid 4. The thinner 6 is stored in a container 7. The roller 5 is continuously rotated in one direction and draws up the thinner 6 out of the container 7, so that the entire surface of the roller is supplied with the thinner 6.

In order to selectively wipe the circumferential surface of the roller 5, a wiper 41 formed of a blade is arranged adjacent to the roller 5. The wiper 41 is made of a chemical resistant resin, such as poly-tetrafluoroethylene (PTFE) or poly (chlorotrifluoro-ethylene) (PCTFE), or a rubber, such as perfluoro-elastomer, and has a tip end portion to be brought into contact with the circumferential surface of the roller 5 to remove the processing liquid or the like therefrom. The tip end portion of the wiper 41 has a wedge-like cross section, but may have another arbitrary shape, such as a rectangular cross section or a fork-like cross section, so long as it can effectively remove the processing liquid.

The wiper 41 is linearly reciprocated between a project position and a retreat position by an air cylinder 40 under control of the control unit 50. At the project position, the tip end portion of the wiper 41 is brought into contact with the circumferential surface of the roller 5 to wipe it. At the retreat position, the tip end portion of the wiper 41 is located away from the circumferential surface of the roller 5 so as not to wipe it.

The nozzle shifter 10, the valve 22 for the processing liquid 4, and the air cylinder 40 for the wiper 41 are controlled in closer cooperation by the control unit 50 to perform several modes, as described later. For example, the nozzle shifter 10 is controlled by the control unit 50 to move the nozzle, after a coating process, from the supply position P2 to the wait position P1, at which the nozzle 3 is caused to wait for the next coating process. The wait position is provided with a sensor 30 formed of a photo-sensor. When the nozzle 3 is located at the wait position P1, a signal S1 for denoting this state is generated and inputted into the control unit 50.

A detailed explanation will be given about an operation of the coating apparatus having the above described structure, with reference to FIG. 4.

[Returning Mode]

Figure 4:
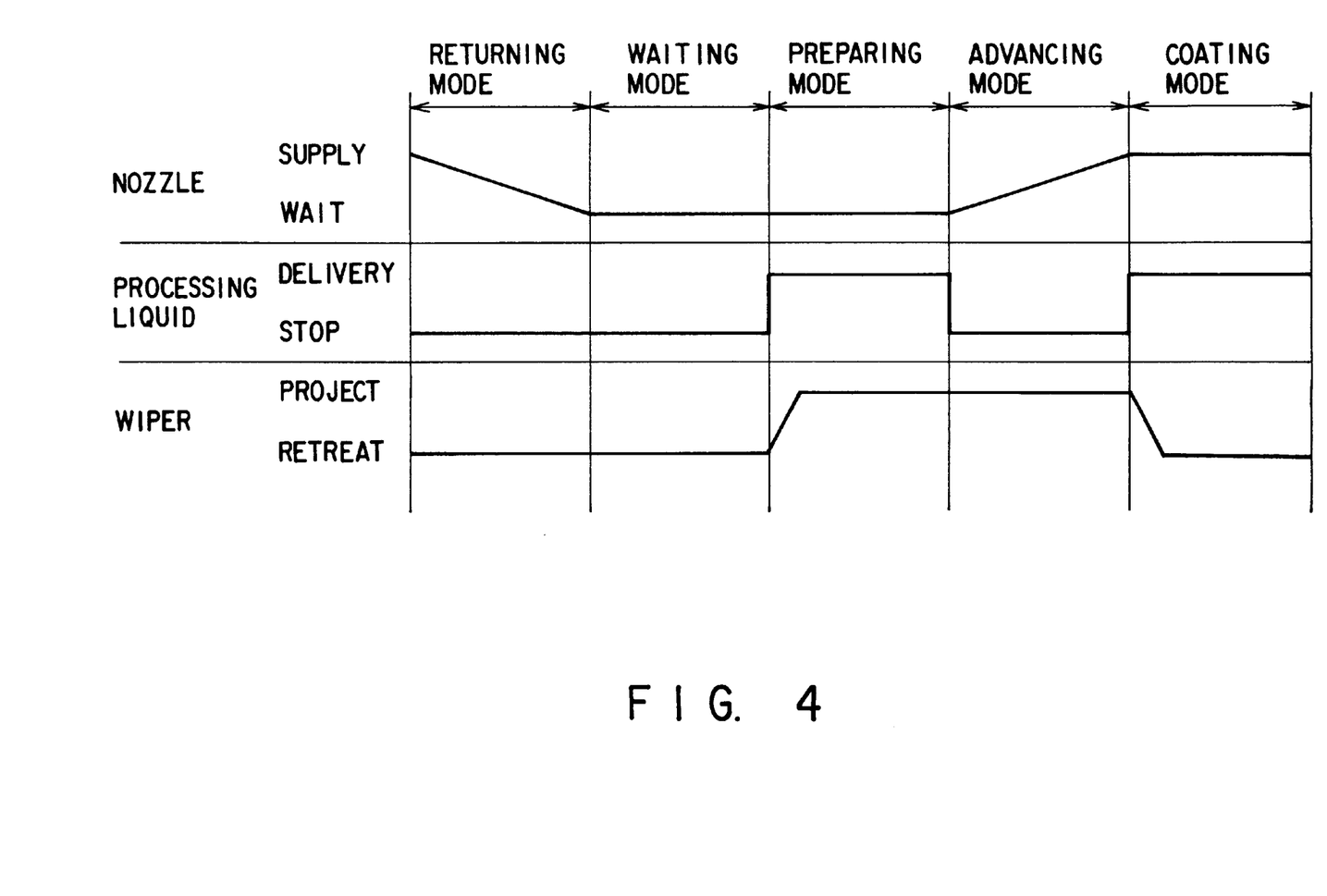
FIG. 4 is a timing chart showing operation modes performed in the coating apparatus shown in FIG. 1.

As shown in FIG. 4, the control unit 50 performs a returning mode to move the nozzle 3 from the supply position P2 to the wait position P1, after a preceding wafer W has been subjected to a coating process with the processing liquid 4. In the returning mode, the valve 22 is turned off, so that delivery of the processing liquid 4 for the tip port 3*a* of the nozzle 3 is stopped. In this embodiment, delivery of the processing liquid 4 is turned to stop at the moment when the nozzle 3 finishes coating the preceding wafer W at the supply position P2. Further, in the returning mode, the wiper 41 is located at the retreat position, which is separated from the circumferential surface of the roller 5.

The control unit 50 drives the nozzle shifter 10 until the light of the sensor 30 is shut off by the nozzle 3, in the returning mode. The control unit 50 stops the nozzle 3, when the control unit 50 receives a signal S1 denoting that the sensor 30 detects the nozzle 3, i.e. when the nozzle 3 has arrived at the wait position P1. At the wait position P1, the tip port 3*a* of the nozzle 3 faces the circumferential surface of the roller 5 with a small gap therebetween.

[Waiting Mode]

Figure 2:
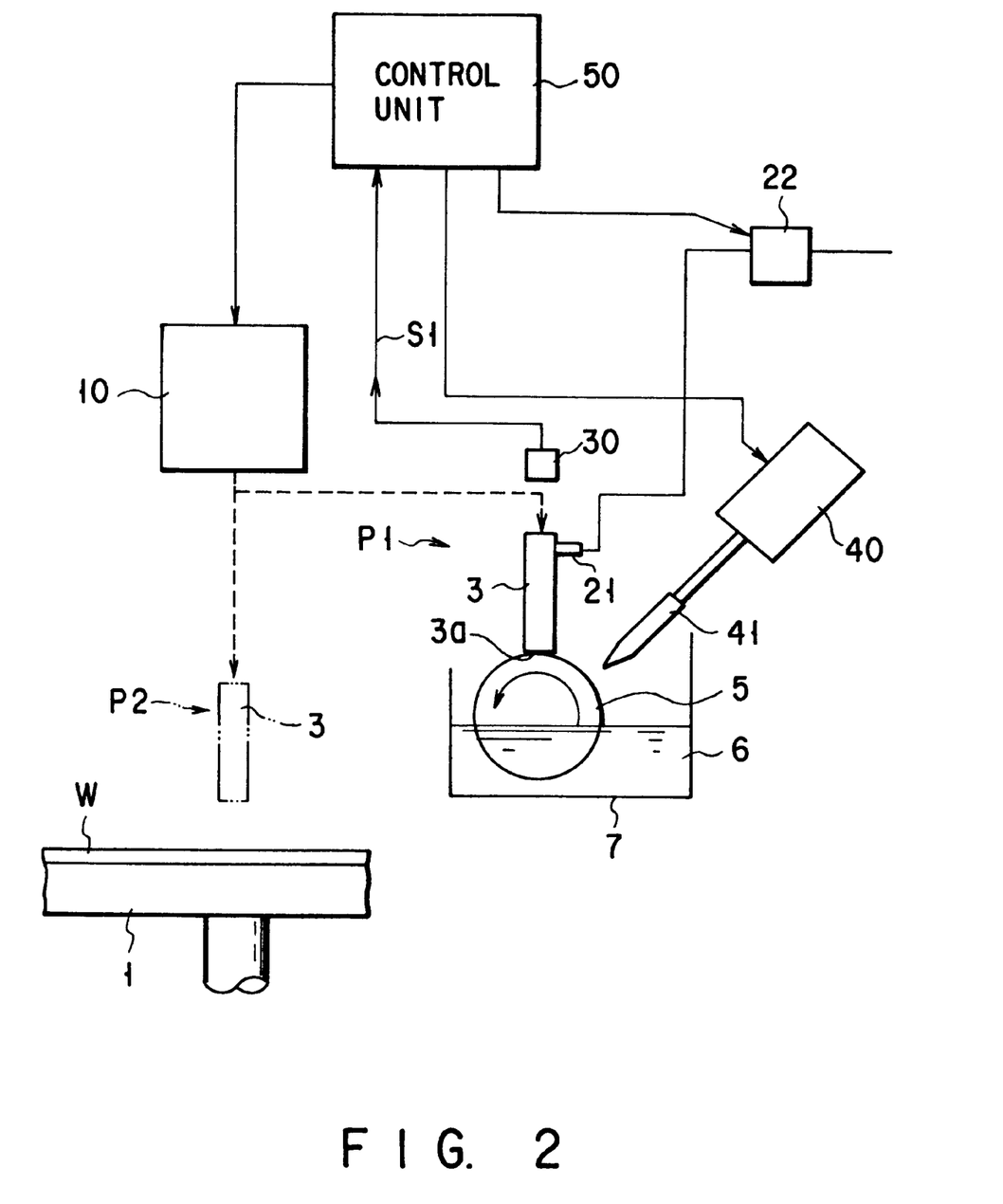
FIG. 2 is a structural view schematically showing a waiting mode performed in the coating apparatus shown in FIG. 1.

When the nozzle 3 is stopped at the wait position P1, the control unit 50 turns the returning mode directly into a waiting mode and performs this mode. In the waiting mode, delivery of the processing liquid 4 form the tip port 3*a* of the nozzle 3 remains stopped and the wiper 41 remains at the retreat position. With these conditions, the tip port 3*a* of the nozzle 3 is wetted by the thinner 6 present on the circumferential surface of the roller 5, so that the processing liquid, i.e., the photo-resist liquid 4 is prevented from drying.

More specifically, the valve 22 remains turned off, as in the returning mode, so that delivery of the processing liquid 4 from the tip port 3*a* of the nozzle 3 remains stopped. In other words, as described above, delivery of the processing liquid 4 is turned to stop when the coating process to the wafer W is finished. As a result, delivery of the processing liquid 4 remians stopped, while the nozzle 3 is moved from the supply position P2 to the wait position P1 in the returning mode, and is stopped at the wait position P1 to transfer into the waiting mode.

While delivery of the processing liquid, i.e., the photo-resist liquid 4, is stopped, the tip port 3*a* of the nozzle 3 tends to become dry. However, at the wait position P1, the tip port 3*a* of the nozzle 3 is wetted by the thinner 6 present on the circumferential surface of the roller 5, so that the processing liquid 4 is prevented from drying. The thinner 6 is drawn up from the container 7 by the roller, which has a lower part dipped in the thinner 6 and is continuously rotated in one direction, so that the thinner 6 can be supplied onto the entire circumferential surface of the roller 5.

In the waiting mode, if the wiper 41 is located at the project position, the thinner 6 present on the circumferential surface of the thinner 6 is removed by the wiper 41, thereby causing the tip port 3*a* of the nozzle 3 to become dry. For this reason, in the waiting mode, the wiper 41 is located at the retreat position such that its tip end portion is separated from the circumferential surface of the roller 5. More specifically, in the waiting mode, the cylinder 40 keeps its state used in the returning mode, so that the wiper 41 remains at the retreat position.

[Preparing Mode]

Figure 3:
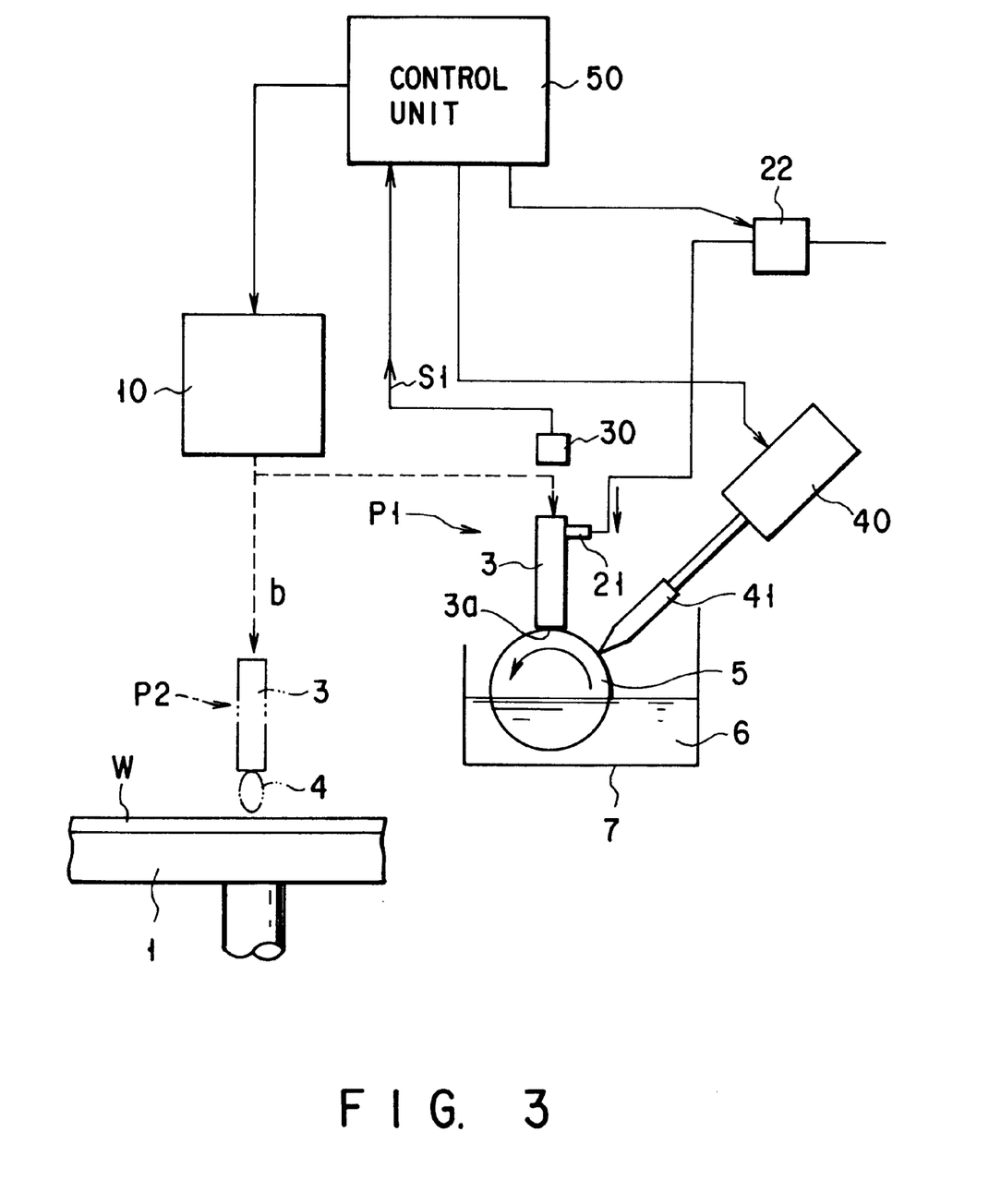
FIG. 3 is a structural view schematically showing a preparing mode performed in the coating apparatus shown in FIG. 1.

The control unit 50 turns the waiting mode directly into a preparing mode and performs this mode, after the waiting mode and immediately before the nozzle 3 is moved from the wait position P1 to the supply position P2. In the preparing mode, the processing liquid 4 is delivered, as a dummy dispense, from the tip port 3*a* of the nozzle 3 onto the circumferential surface of the roller 5. Further, the wiper 41 is located at the project position, so that the processing liquid 4 is removed from the circumferential surface of the roller 5 by the wiper 41.

More specifically, when the preparing mode starts, the valve 22 is turned on to start delivery of the processing liquid, i.e., the photo-resist liquid 4 from the tip port 3*a* of the nozzle 3. By doing so, the first or initial delivery of the processing liquid, which tends to be in a larger amount than at other times, is spouted onto the circumferential surface of the roller 5 and removed therefrom by the wiper 5. Then, the wafer W is supplied with the processing liquid, so that the coating film of the processing liquid can have a uniform thickness.

Further, in the preparing mode, the air cylinder 40 is activated, so that the wiper 41 is located at the project position. In this state, the tip end portion of the wiper 41 is in contact with the circumferential surface of the roller, and wipes the circumferential surface of the roller to remove the processing liquid, i.e., the photo-resist 4, delivered thereon. The wiper 41 may be moved to the project position at a moment immediately before or immediately after the valve 22 is turned on, as well as at a moment in synchronism with the valve 22 being turned on.

[Advancing Mode]

After the preparing mode is performed for a predetermined time, the control unit 50 turns the preparing mode directly into an advancing mode and performs this mode to move the nozzle 3 from the wait position P1 to the supply position P2. In the advancing mode, the valve 22 is turned off, so that delivery of the processing liquid 4 from the tip port 3a of the nozzle 3 is stopped. In this embodiment, delivery of the processing liquid 4 is turned to stop at the moment when the nozzle 3 finishes the preparing mode at the wait position P1. Further, in the advancing mode, the cylinder 40 keeps its state used in the preparing mode, so that the wiper 41 remains at the project position.

In the advancing mode, the control unit 50 drives the nozzle shifter 10 to move the nozzle 3, by combining, for example, several movements of the nozzle 3, such that the nozzle 3 is first moved up from the wait position p1, is then moved laterally, and is then moved down to the supply position P2. The control unit 50 stops the nozzle 3 at the supply position P2 on the basis of a signal from the sensor (not shown) arranged at the supply position P2. The tip port 3a of the nozzle 3 is positioned above the near center of wafer W held by the spin chuck 1.

[Coating Mode]

When the nozzle is stopped at the supply position P2, the control unit 50 turns the advancing mode directly into a coating mode and performs this mode. In the coating mode, the processing liquid 4 is delivered from the tip port 3a of the nozzle 3 onto the wafer W. During the processing liquid 4 being delivered, the spin chuck 1 is rotated at high speed with the wafer W held thereon. As a result, the processing liquid, i.e., the photo-resist liquid 4, is diffused from the center of the wafer W to its periphery, so that the entire top surface of the wafer W is coated with the photo-resist liquid.

Further, in the coating mode, the air cylinder 40 is activated, so that the wiper 41 is located at the retreat position. In this state, the circumferential surface of the roller 5 is cleaned by the thinner 6, which is not removed by the wiper 41.

Although, the coating apparatus, which is used for processing a semiconductor wafer, is described in the above described embodiment, the present invention may be applied to a coating apparatus for processing, for example, an LCD substrate. Where the LCD substrate is processed, a slit nozzle may be used for delivering a photo-resist liquid in a band, in place of the above described pipe nozzle. Further, a chuck plate, which is horizontally movable or is fixed, may be used to hold the LCD substrate, in place of the above described spin chuck. In this case, the nozzle and the chuck plate should be movable relative to each other.

Figure 5:
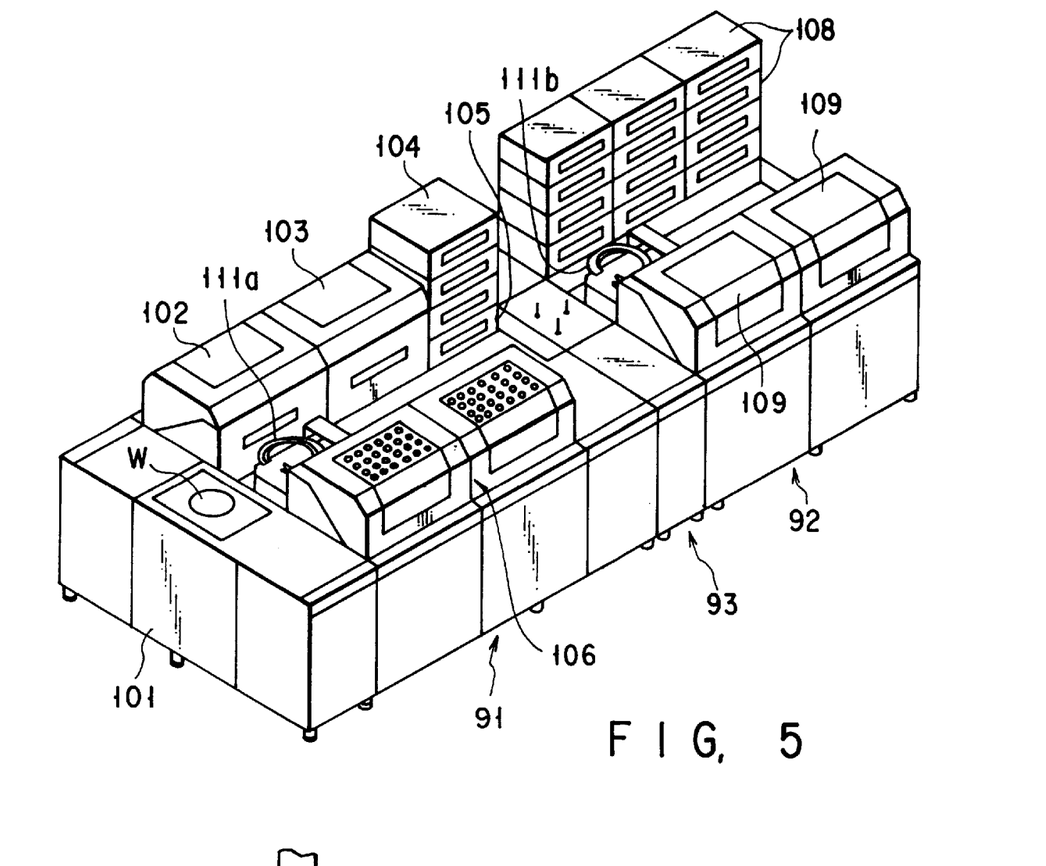
FIG. 5 is a perspective view showing a coating and developing system having the coating apparatus shown in FIG. 1.

A coating apparatus according to the present invention may be used as an independent coating apparatus for coating a semiconductor wafer or an LCD substrate with a photo-resist liquid, or may be used as a unit incorporated in a coating and developing system as shown in FIG. 5.

The coating and developing system shown in FIG. 5 has a loading section 101, a first processing block 91 next to the loading section 101, and a second processing block 92 connected to the first processing block 91 through an interface section 93. The loading section 101 is used for transferring semiconductor wafers W to be processed into and out of the system.

In the first processing block 91, a brush scrubbing apparatus 102 for brush-scrubbing and washing a wafer W is arranged adjacent to the loading section 101. A jet-water washing apparatus 103 for washing the wafer W by means of jet water of a high-pressure is arranged next to the brush scrubbing apparatus 102. Further, an adhesion apparatus 104 for subjecting the surface of the wafer W to a hydrophobic treatment is arranged next to the jet-water washing apparatus 103. A cooling apparatus 105 for cooling the wafer W down to a predetermined temperature is arranged under the adhesion apparatus 104. A photo-resist coating apparatus 106 is arranged to face the apparatuses 102 to 105 through a wafer transfer passage. The photo-resist coating apparatus 106 has a coating mechanism for coating the wafer W with a photo-resist, and a coating film removing mechanism for removing an unnecessary part of the photo-resist film on the marginal region of the wafer W. The coating mechanism of the photo-resist coating apparatus 106 has a structure, as described with reference to FIGS. 1 to 4. A wafer transfer arm 111a is arranged on the wafer transfer passage to be movable along the passage.

In the second processing block 92, a heating apparatus 108 is arranged for heating the wafer W before and after the photo-resist coating process, to perform pre-baking and post-baking treatments. A developing apparatus 109 is arranged to face the heating apparatus 108 through the wafer transfer passage. The developing apparatus 109 has members for subjecting the wafer, which has been light-exposed, to a developing treatment, and for rinsing the developed photo-resist pattern. A wafer transfer arm 111b is arranged on the wafer transfer passage to be movable along the passage. A light-exposing apparatus (not shown) is connected to the second processing block 92 on the far side, for projecting a circuit pattern of chips, which are to be formed on the wafer W, onto photo-resist film on the wafer W.

In the coating and developing system having the above described structure, an unprocessed wafer W is received by the wafer transfer arm 111a from the loading section 101, and is transferred into the brush scrubbing apparatus 102. After being subjected to a brush-scrubbing and washing treatment in the brush scrubbing apparatus 102, the wafer W is cleaned by means of jet water of a high-pressure in the jet-water washing apparatus 103. After being cleaned, the wafer W is subjected to a hydrophobic treatment in the adhesion apparatus 104. Then, the wafer W is cooled in a cooling apparatus 105, and is transferred into the photo-resist coating apparatus 106. In the coating apparatus, the photo-resist liquid is applied onto the wafer W to form a coating film in accordance with the above described sequence, and then an unnecessary part of the photo-resist film on the marginal region of the wafer W is removed. As a result, when being delivered therefrom, the wafer W has no photo-resist film on its edge, so that no photo-resist film adheres to the transfer arms 111a and 111b.

Then the photo-resist film left on the wafer is subjected to a baking treatment by means of heating in a heating apparatus 108, and is exposed to light with a predetermined pattern in the light-exposing apparatus (not shown). After being light-exposed, the wafer W is transferred to the developing apparatus 109, and is subjected to a developing treatment with a developing liquid. Then, the developing liquid is washed away by a rinsing liquid, so that the developing treatment is completed. After the developing treatment, the wafer W is transferred into a cassette (not shown) in the loading section 101, and is then transferred therefrom to the next process.

In the above described embodiment, the present invention is applied to a coating apparatus for coating a semiconductor wafer or an LCD substrate with a coating liquid, such as a developing liquid or a photo-resist liquid. The present invention, however, may be applied to a coating apparatus of another type, e.g., for coating another target substrate, such as a CD, with a coating liquid, or for coating an electric board with a green film. Further, another coating liquid, such as a polyimide-based coating liquid (PIQ) or a coating liquid containing a glass component (SOG) may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A coating method of coating a target object with a photo-resist delivered from a tip port of a nozzle, which is movable between a supply position for supplying said photo-resist onto said target object and a wait position for waiting when not supplying said photo-resist onto said target object, such that, in said wait position, said tip port of said nozzle is wetted by a solvent for said photo-resist, said solvent being present on a circumferential surface of a rotatable roller which is configured to be wiped by a wiper, said circumference surface of said roller being supplied with said solvent by dipping part of said roller in said solvent, said method comprising the steps of:

performing a waiting mode, during which said nozzle is located at said wait position, wherein, in said waiting mode, delivery of said photo-resist from said tip port of said nozzle is stopped and said wiper is located at a retreat position, such that said tip port of said nozzle is wetted by said solvent present on said circumferential surface of said roller;

performing a preparing mode, during which said nozzle is located at said wait position, after said waiting mode and immediately before moving said nozzle from said wait position to said supply position, wherein, in said preparing mode, said photo-resist is delivered from said tip port of said nozzle onto said circumferential surface of said roller, and said wiper is located at a project position such that said photo-resist is removed from said circumferential surface of said roller;

performing a coating mode, during which said nozzle is located at said supply position, after said preparing mode, wherein, in said coating mode, said photo-resist is delivered from said tip port of said nozzle such that said photo-resist is applied to said target object, and said wiper is located at said retreat position; and performing a returning mode, during which said nozzle is moved from said supply position to said wait position, after said coating mode, wherein in said returning mode, said wiper is located at said retreat position.

2. The method according to claim 1, wherein there are no intervening modes between said waiting mode and said preparing mode.

3. The method according to claim 1, further comprising:

performing an advancing mode, during which said nozzle is moved from said wait position to said supply position, between said preparing mode and said coating mode, wherein, in said advancing mode, said wiper is located at said project position.

4. The method according to claim 1, wherein, in said returning mode, delivery of said photo-resist from said tip port of said nozzle is stopped.

5. The method according to claim 4, wherein there are no intervening modes between said returning mode and said waiting mode.

6. The method according to claim 1, wherein said roller is rotated in one direction in said waiting mode.

7. The method according to claim 1, wherein said wiper is linearly moved when said wiper is moved between said project position and said retreat position.

8. The method according to claim 1, wherein said target object consists of at least one of a semiconductor wafer and an LCD substrate.

9. The method according to claim 3, wherein, in said advancing mode, delivery of said photo-resist from said tip port of said nozzle is stopped.

10. A coating method of coating a target object consisting of at least one of a semiconductor wafer and an LCD substrate with a photo-resist delivered from a tip port of a nozzle, which is movable between a supply position for supplying said photo-resist onto said target object and a wait position for waiting when not supplying said photo-resist onto said target object, such that, in said wait position, said tip port of said nozzle is wetted by a solvent for said photo-resist, said solvent being present on a circumferential surface of a rotatable roller configured to be wiped by a wiper, said method comprising the steps of:

performing a waiting mode, during which said nozzle is located at said wait position, wherein, in said waiting mode, delivery of said photo-resist from said tip port of said nozzle is stopped and said wiper is located at a retreat position, such that said tip port of said nozzle is wetted by said solvent present on said circumferential surface of said roller;

performing a preparing mode, during which said nozzle is located at said wait position, after said waiting mode and immediately before moving said nozzle from said wait position to said supply position, wherein, in said preparing mode, said photo-resist is delivered from said tip port of said nozzle onto said circumferential surface of said roller, and said wiper is located at a project position such that said photo-resist is removed from said circumferential surface of said roller;

performing an advancing mode, during which said nozzle is moved from said wait position to said supply position, after said preparing mode, wherein, in said advancing mode, said wiper is located at said project position;

performing a coating mode, during which said nozzle is located at said supply position, after said advancing mode, wherein, in said coating mode, said photo-resist is delivered from said tip port of said nozzle such that said photo-resist is applied to said target object, and said wiper is located at said retreat position; and performing a returning mode, during which said nozzle is moved from said supply position to said wait position, after said coating mode, wherein, in said returning mode, said wiper is located at said retreat position.

11. The method according to claim 10, wherein said circumference surface of said roller is supplied with said solvent by dipping part of said roller in said solvent.

12. The method according to claim 11, wherein said roller is rotated in one direction in said waiting mode.

13. The method according to claim 11, wherein said wiper is linearly moved when said wiper is moved between said project position and said retreat position.

14. The method according to claim 11, wherein there are no intervening modes between said waiting mode and said preparing mode.

15. The method according to claim 11, wherein there are no intervening modes between said returning mode and said waiting mode.

16. The method according to claim 11, wherein, in said advancing mode, delivery of said photo-resist from said tip port of said nozzle is stopped.

17. The method according to claim 11, wherein, in said returning mode, delivery of said photo-resist from said tip port of said nozzle is stopped.

* * * * *